United States Patent [19]

Ki

[11] Patent Number: 5,757,174
[45] Date of Patent: May 26, 1998

[54] CURRENT SENSING TECHNIQUE USING MOS TRANSISTOR SCALING WITH MATCHED CURRENT SOURCES

[75] Inventor: Wing-Hung Ki, San Jose, Calif.

[73] Assignee: Micro Linear Corporation, San Jose, Calif.

[21] Appl. No.: 504,194

[22] Filed: Jul. 19, 1995

[51] Int. Cl.$^6$ .................. G05F 1/565; G05F 1/575
[52] U.S. Cl. .................. 323/284; 323/285; 323/315
[58] Field of Search ................. 323/281–287, 323/277, 315, 316, 317

[56] References Cited

U.S. PATENT DOCUMENTS

| | | | |
|---|---|---|---|
| 4,311,954 | 1/1982 | Capel | 323/222 |
| 4,465,967 | 8/1984 | Tokunaga et al. | 323/285 |
| 4,529,927 | 7/1985 | O'Sullivan et al. | 323/222 |
| 4,661,766 | 4/1987 | Hoffman et al. | 323/287 |
| 4,672,303 | 6/1987 | Newton | 323/285 |
| 4,820,968 | 4/1989 | Wrathall | 323/316 |
| 4,845,420 | 7/1989 | Oshizawa et al. | 323/222 |
| 4,885,477 | 12/1989 | Bird et al. | 323/316 |
| 4,929,882 | 5/1990 | Szepesi | 323/222 |
| 4,940,929 | 7/1990 | Williams | 323/222 |
| 4,941,080 | 7/1990 | Sieborger | 363/127 |
| 4,947,309 | 8/1990 | Jonsson | 363/17 |
| 5,008,586 | 4/1991 | Miyazaki et al. | 323/315 |
| 5,014,020 | 5/1991 | Hayashi et al. | 330/257 |
| 5,043,655 | 8/1991 | Anholm Jr, et al. | 364/481 |
| 5,138,249 | 8/1992 | Capel | 323/283 |
| 5,146,152 | 9/1992 | Jin et al. | 323/281 |
| 5,262,713 | 11/1993 | Agiman | 323/315 |
| 5,365,161 | 11/1994 | Inoue et al. | 323/282 |
| 5,414,341 | 5/1995 | Brown | 323/268 |
| 5,450,000 | 9/1995 | Olsen | 323/222 |
| 5,479,089 | 12/1995 | Lee | 323/283 |
| 5,481,178 | 1/1996 | Wilcox et al. | 323/287 |
| 5,502,370 | 3/1996 | Hall et al. | 323/284 |
| 5,519,310 | 5/1996 | Bartlett | 323/316 |
| 5,532,577 | 7/1996 | Doluca | 323/282 |
| 5,552,695 | 9/1996 | Schwartz | 323/271 |
| 5,592,071 | 1/1997 | Brown | 323/282 |
| 5,610,502 | 3/1997 | Tallant, II et al. | 323/222 |
| 5,617,306 | 4/1997 | Lai et al. | 363/17 |
| 5,627,460 | 5/1997 | Bazinet et al. | 323/288 |

*Primary Examiner*—Peter S. Wong
*Assistant Examiner*—Derek J. Jardieu
*Attorney, Agent, or Firm*—Haverstock & Associates

[57] ABSTRACT

A technique for sensing current that employs an internal current sensing resistor. Two current sources of small and equal magnitude pull currents from two identical PNP transistors. Two PMOS transistors supply current to the PNP transistors. The PMOS transistors are scaled so the transistor on the output side of the circuit has an aspect ratio much greater than that of the transistor on the sensing side of the circuit. The result is that the currents through the PMOS transistors are proportional to each other and the current on the sensing side is much smaller than the current on the output side. The output current is the difference between the current through the PMOS transistor with the greater aspect ratio and the current through one of the small current sources. The sensing current, which passes through the internal sensing resistor, is the difference between the current flowing through the PMOS transistor with the lesser aspect ratio and the current flowing through the other small current source. The result is that the current flowing through the sensing resistor is substantially proportional to and much smaller than the current flowing through the load. The dual of this circuit, employing NMOS scaled transistors and matched NPN transistors achieves the same effect.

14 Claims, 2 Drawing Sheets

5,757,174

CURRENT SENSING TECHNIQUE USING MOS TRANSISTOR SCALING WITH MATCHED CURRENT SOURCES

FIELD OF THE INVENTION

This invention relates to a current sensing technique using MOS transistor scaling with matched current sources. More specifically, the invention relates to such a current sensing technique for current-programming trailing edge modulated buck converter controllers.

BACKGROUND OF THE INVENTION

In conventional current programming step down converters, a method of sensing the inductor current at the output utilizes a sensing resistor in series with the inductor. The sensing resistor has a low impedance and a high power rating. This approach has several drawbacks: (1) special attention must be paid to the layout of the sensing resistor on the circuit board because metal trace resistance is on the same order of magnitude, (2) the sensing resistor consumes a considerable proportion of the output power because all of the output current must pass through the sensing resistor, and (3) the sensing resistor requires an additional pin on the converter controller integrated circuit chip package.

What is needed is a circuit for sensing the output current of a converter without requiring the entire output current to pass through a sensing resistor.

SUMMARY OF THE INVENTION

It is an object of the present invention to generate a scaled down version of the output current within the controller and to measure the scaled down version of the output current by using an internal sensing resistor.

Two current sources of small and equal magnitude pull currents from two identical bipolar PNP transistors. Two PMOS transistors supply current to the PNP transistors. The PMOS transistors are scaled so that the transistor on the output side of the circuit has an aspect ratio that is greater than the aspect ratio of the transistor on the sensing side of the circuit. The result is that the current on the sensing side is much smaller than, and proportional to, the current on the output side. The output current is the difference between the current through the PMOS transistor with the greater aspect ratio and the current through one of the small current sources. The sensing current, which passes through the internal sensing resistor, is the difference between the current flowing through the PMOS transistor with the lesser aspect ratio and the current flowing through the other small current source. The result is the current flowing through the sensing resistor is substantially proportional to and much smaller than the current flowing through the load.

The voltage across the sensing resistor is coupled to a control circuit which employs a feedback loop for monitoring the output voltage and the inductor current for maintaining a constant output voltage level. The control circuit controls the voltage level at the gate of the PMOS transistor on the output side of the circuit. When this transistor is turned on, the output inductor current ramps up. A scaled version of the inductor current flows through the sensing resistor. The ON-cycle peak current level through the inductor is determined by the voltage across the sensing resistor. When the PMOS transistor on the output side of the circuit is OFF, the inductor current ramps down. However, the voltage across the sensing resistor during the OFF-cycle plays no part in the feedback loop; all the information for switching is obtained during the ON-cycle (the inductor current ramp-up portion of the cycle).

The technique of this invention may be accomplished with a dual of the circuit described above, wherein two current sources of small and equal magnitude deliver current to two bipolar NPN transistors and wherein two scaled NMOS transistors draw current from the two bipolar transistors.

DETAILED DESCRIPTION OF THE PREFERRED EMBODIMENT

Figure 1:
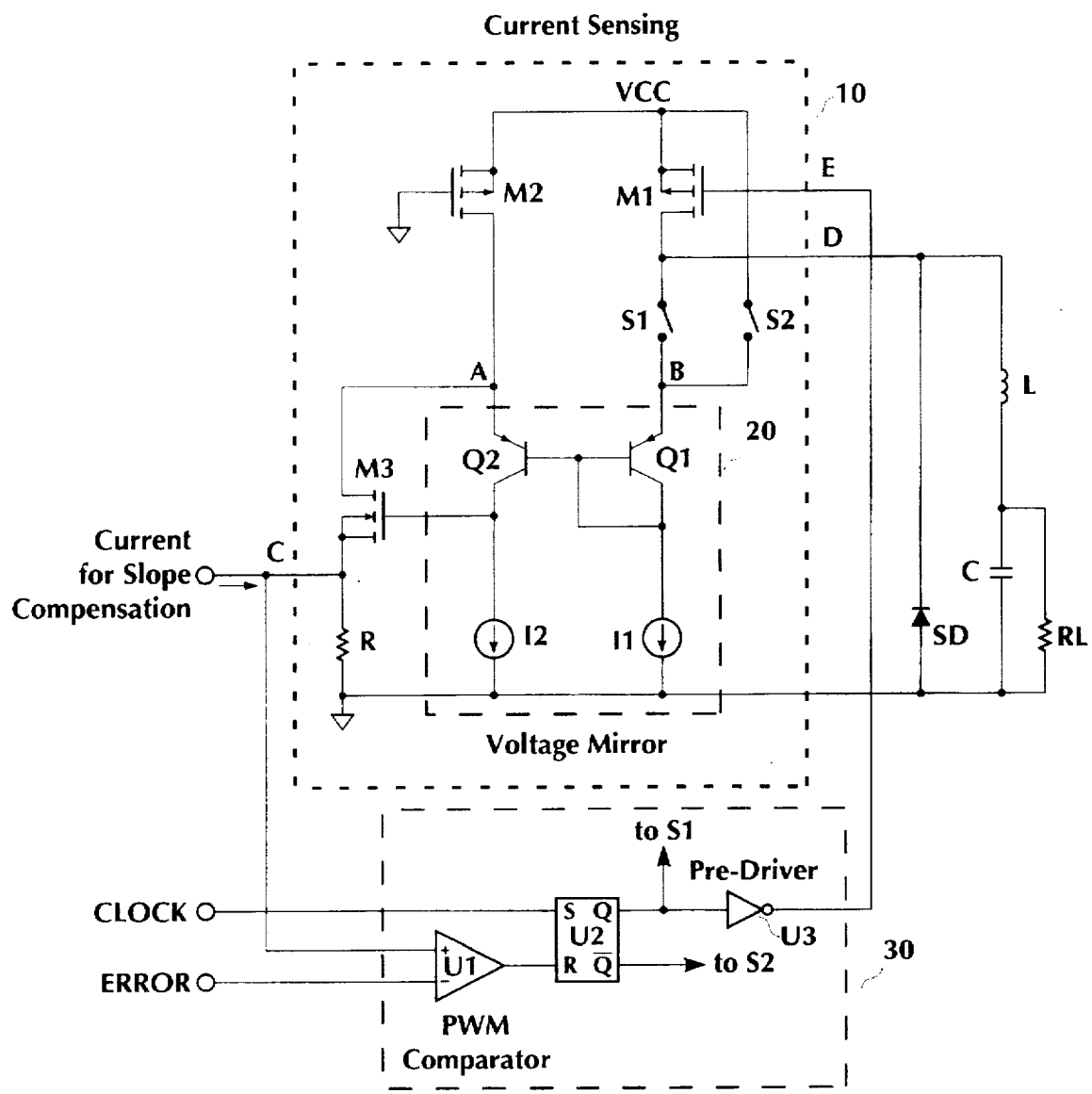
FIG. 1 shows a circuit schematic diagram according to the PMOS implementation of the preferred embodiment of the present invention.

FIG. 1 shows a schematic diagram of a circuit implementation of the preferred embodiment of the present invention. FIG. 1 shows a current sensing circuit 10, a control circuit 30, Schottky diode SD, inductor L, capacitor C and load RL.

The current sensing circuit 10 comprises a voltage mirror circuit 20, a power supply node Vcc, a circuit ground node GND, a node A, a node B and a node C. The source of a first PMOS transistor M1 is coupled to the power supply node Vcc. The gate of the PMOS transistor M1 is coupled to be controlled by the control circuit 30. The drain of the PMOS transistor M1 is coupled to a first terminal of a switch S1 and to the node D. A second terminal of the switch S1 is coupled to the node B. A first terminal of a second switch S2 is coupled to the power supply node Vcc. A second terminal of the switch S2 is coupled to the output B. The operation of the switches S1 and S2 is controlled by the control circuit 30. The emitter of a PNP transistor Q1 is coupled to the node B. The source of a second PMOS transistor M2 is coupled to the power supply node Vcc. The gate of the second PMOS transistor M2 is coupled to the ground node GND. The drain of the second PMOS transistor M2 is coupled to the node A. The emitter of a second PNP transistor Q2 and the drain of an NMOS transistor M3 are also coupled to the node A. The base of the second PNP transistor Q2 is coupled to the base of the first PNP transistor Q1 and to the collector of the first PNP transistor Q1. The collector of the first PNP transistor Q1 is also coupled to a first terminal of a current source I1. A second terminal of the current source I1 is coupled to the circuit ground node GND. The collector of the second PNP transistor Q2 is coupled to the gate of the NMOS transistor M3 and to a first terminal of a second current source I2. A second terminal of the second current source I2 is coupled to the circuit ground node GND. A first terminal of a sensing resistor R is coupled to the source of the NMOS transistor M3 and to a node C. A second terminal of the sensing resistor R is coupled to the circuit ground node GND.

A cathode of a Schottky diode SD and a first terminal of an inductor L are coupled to the node D. An anode of the Schottky diode SD is coupled to the ground node. A second terminal of the inductor L is coupled to a first terminal of a capacitor C and coupled to a first terminal of a load RL. A second terminal of the capacitor C and a second terminal of the load RL are coupled to the ground node GND.

The node C is also coupled to a non-inverting input to a comparator U1 of the control circuit 30. An inverting input of the comparator U1 is coupled to receive a voltage signal ERROR that is representative of a difference between a voltage across the load RL and a desired voltage across the load RL. The output from the comparator U1 is coupled to a RESET input to a flip-flop U2 of the control circuit 30. A SET input of the flip-flop U2 is coupled to receive a clock signal CLK. An output Q of the flip-flop U2 is coupled to an input to a pre-driver circuit U3 of the control circuit 30. The output Q of the flip-flop U2 is also coupled to control the switch S1. An output $\overline{Q}$ is coupled to control the switch S2. An output from the pre-driver circuit U3 is coupled to control the gate of the transistor M1. The output of the pre-driver circuit is an inverting output. The control circuit 30 employs a feedback loop which monitors the output voltage level and the inductor current for maintaining the output voltage across the load RL at a constant level. It will be apparent that the switches S1 and S2 may be implemented with transistors.

The two current sources I1 and I2, may be any circuits known in the art for sourcing current. The two current sources I1, I2, preferably carry equal currents, however, it is not necessary that they be equal in order to practice the invention. The aspect ratios of the PMOS transistors M1 and M2, are such that the aspect ratio of M1 is greater than the aspect ratio of M2. In the preferred embodiment, the ratio of aspect ratios is 5000-to-1 to achieve a current ratio of 5000-to-1. This ratio may be achieved by M1 comprising 500 transistors having width=100 micrometers and length=2 micrometers, in parallel and M2 comprising 10 of those same transistors in series. The PNP transistors Q1 and Q2 have substantially equal characteristics.

The two current sources I1 and I2, of small and preferably equal magnitude, pull currents, for example, of 1 micro-amp each, from the two equivalent PNP transistors Q1 and Q2. The base of the transistor Q1 is coupled to its collector and to the base of the transistor Q2 to provide base currents for both transistors. With the transistors Q1 and Q2 operating in their linear regions, and with nearly equal emitter currents, the voltage from base to emitter of both of the transistors Q1 and Q2 is nearly equal. The emitter currents differ by a factor of 1/(1+beta) where beta is the ratio of base to emitter current and is usually large enough that 1/(1+beta) is small. The result is that the voltage at the node A is nearly equal to the voltage at the node D. When the transistor M1 is on, the switch S1 is closed. Because the voltage at the node A, which is coupled to the drain of the transistor M2, is nearly equal to the voltage at the node D, which is coupled to the drain of the transistor M1, the voltage at the drain of the transistor M1 is nearly equal to the voltage at the drain of the transistor M2. Because the source of the transistor M1 is coupled to the supply voltage Vcc and the source of the transistor M2 is coupled to the supply voltage Vcc, the voltage at the source of the transistor M1 is equal to the voltage at the source of the transistor M2. Because the gate of the transistor M2 is coupled to the ground node GND and, when the transistor M1 is ON, the gate of the transistor M1 is coupled to the ground node GND, the voltage level at the gate of the transistor M1 is equal to the voltage at the gate of the transistor M2 when the transistor M1 is ON. The aspect ratio of the transistor M1 is greater than the aspect ratio of the transistor M2. It follows that, during the period when the transistor M1 is ON, the drain current of the transistor M2 is proportional to, but smaller that the drain current of the transistor M1. By summing the currents at the node A, the current through the sensing resistor R is equal to the difference between the drain current of the transistor M2 and the emitter current of the transistor Q2. By summing the currents at the node B, the output current through the inductor L is equal to the difference between the drain current of the transistor M1 and the emitter current of the transistor Q1. Because the current through the current source I1 is nearly equal to the emitter current of the transistor Q1, the current through the current source I2 is nearly equal to the emitter current of the transistor Q2, the current sources I1 and I2 source equal currents, and the drain current of the transistor M2 is proportional to, but smaller than, the drain current of the transistor M1, it follows that the current through the sensing resistor R is substantially proportional to, but smaller than the output current through the inductor L. Therefore, the output current can be monitored by monitoring the smaller, but proportionate, current through the sensing resistor R.

The control circuit 30 generates a fixed frequency control signal having a variable duty cycle. The duty cycle of the control signal is dependent upon the value of the voltage level at the node C and upon the difference between the output voltage across the load RL and a desired output voltage level as represented by the signal ERROR. The control circuit operates the switches S1 and S2 from the outputs Q and $\overline{Q}$ of the flip-flop U2, respectively. The output of the pre-driver circuit U3 controls the operation of the transistor M1. The control circuit operates the switches S1 and S2 and the voltage level at the gate of the transistor M1 such that when the transistor M1 is on, the switch S1 is closed and the switch S2 is open; when the transistor M1 is off, the switch S1 is open and the switch S2 is closed. When the transistor M1 is ON, the current through the inductor L ramps up. A corresponding, but scaled down voltage at the node C also ramps up. The ON time is determined by the peak inductor current which is sensed at the node C. Once the current through the inductor L reaches a predetermined level based upon the voltage signal ERROR, the control circuit turns the transistor M1 OFF. The current through the inductor L then ramps down and the drain of the transistor M1 is driven below ground by the inductor current passing through the blocking diode SD. Without the two switches S1 and S2, the circuit would tend to pull the drain of the transistor M2 to ground and result in a large current through the sensing resistor R. The addition of the switches S1 and S2 prevents this from occurring.

A slope compensation circuit (not shown) is coupled to deliver a slope compensation current to the node C. The slope compensation current is a positive ramp that is at least 90% of the clock signal CLK period. This serves to stabilize the feedback loop.

Figure 2:
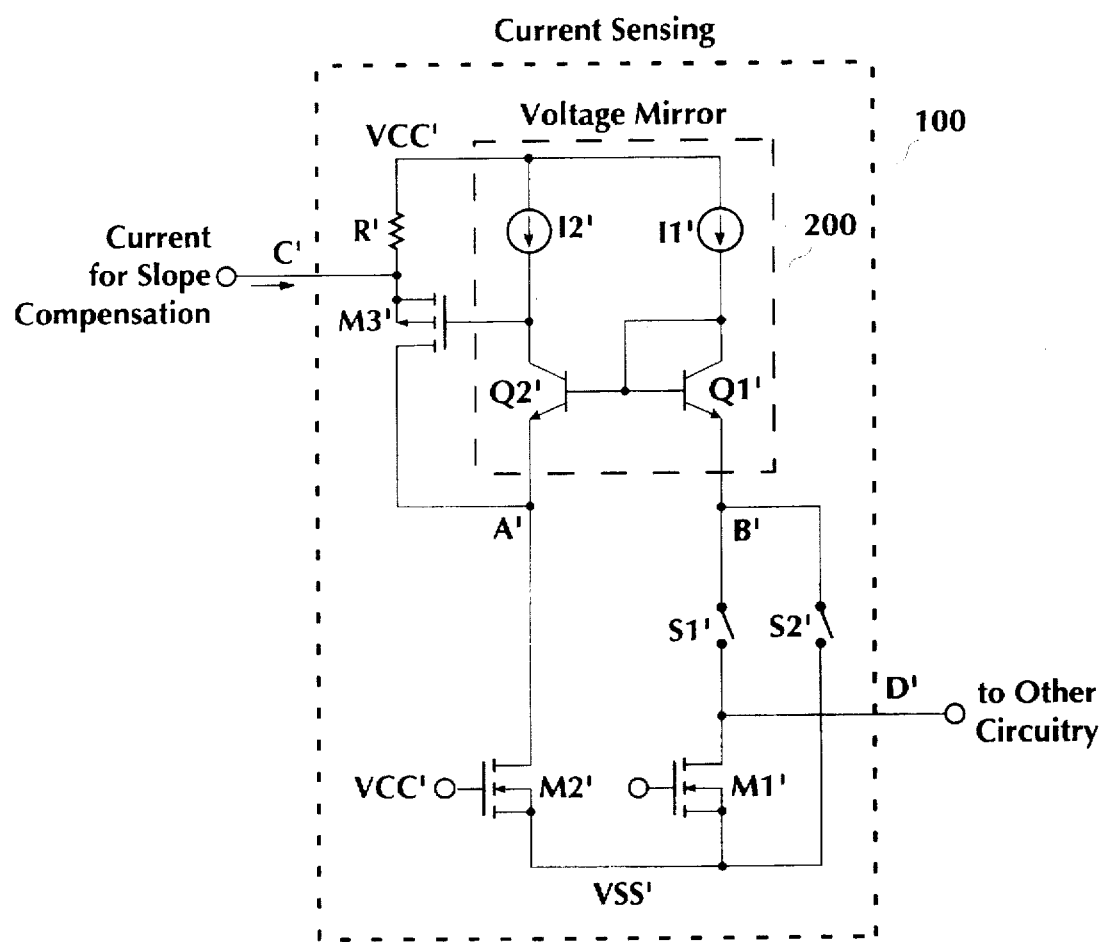
FIG. 2 shows a circuit schematic diagram according to the NMOS implementation of the preferred embodiment of the present invention. The circuit shown in FIG. 2 is the dual of the circuit shown in FIG. 1.

FIG. 2 shows an NMOS implementation of the circuit of the present invention. The circuit operates as the circuit in FIG. 1 except that the circuit in FIG. 2 is essentially the dual of the circuit in FIG. 1. FIG. 2 shows the current sensing circuit 100. The node D' is coupled to the output circuitry, as illustrated in FIG. 1, including the inductor L, the diode SD, the capacitor C and the load RL. The node C' is coupled to the control circuitry 30, as illustrated in FIG. 1. Because FIG. 2 shows an NMOS implementation, the inputs to the comparator U1 are reversed, such that the non-inverting input is coupled to the signal ERROR and the inverting input is coupled to the node C'. The outputs of the control circuit 30 are coupled to control the gate of the transistor M1' and the switches S1' and S2' in a similar fashion, as described above, with respect to the circuit of FIG. 1.

The current sensing circuit 100 of FIG. 2 comprises a voltage mirror 200, a power supply node Vcc', a second supply node Vss', a node A', a node B', a node C' and an output node D'. The source of the NMOS transistor M1' is coupled to the supply node Vss'. The gate of the NMOS transistor M1' is coupled to be controlled by the control circuit 30. The drain of the NMOS transistor M1' is coupled to a first terminal of a switch S1' and to the output node D'. A second terminal of the switch S1' is coupled to the node B'. A first terminal of a second switch S2' is coupled to the supply node Vss'. A second terminal of the switch S2' is coupled to the node B'. An emitter of an NPN bipolar transistor Q1' is coupled to the node B'. The source of a second NMOS transistor M2' is coupled to the supply node Vss'. The gate of the second NMOS transistor M2' is coupled to the power supply node Vcc'. The drain of the second NMOS transistor M2' is coupled to the node A'. The emitter of a second NPN bipolar transistor Q2' and the drain of an PMOS transistor M3' are coupled to the node A'. The base of the second NPN transistor Q2' is coupled to the base of the first NPN transistor Q1' and to the collector of the first NPN transistor Q1'. The collector of the first NPN transistor Q1' is also coupled to a first terminal of the current source I1'. A second terminal of a current source I1' is coupled to the power supply node Vcc'. The collector of the second NPN transistor Q2' is coupled to the gate of the PMOS transistor M3' and to a first terminal of a second current source I2'. A second terminal of the second current source I2' is coupled to the power supply node Vcc'. A first terminal of a sensing resistor R' forms the node C' and is coupled to the source of the PMOS transistor M3'. A second terminal of the sensing resistor R' is coupled to the power supply node Vcc'.

The two current sources I1' and I2', may be any circuits known in the art for sourcing current. The two current sources I1' and I2', carry equal currents. The aspect ratios of the NMOS transistors M1' and M2', are such that the aspect ratio of the transistor M1' is greater than the aspect ratio of the transistor M2'. In the preferred embodiment, the ratio of aspect ratios is 5000-to-1 to achieve a current ratio of 5000-to-1. This ratio may be achieved by the transistor M1' comprising 500 transistors having width=100 micrometers and length=2 micrometers, in parallel and the transistor M2' comprising 10 of those same transistors in series. The NPN transistors Q1' and Q2' have substantially equal characteristics.

The node C' is coupled to receive a slope compensation current and coupled to the inverting input of the comparator U1' of the control circuit 30. The non-inverting input of the comparator U1' is coupled to receive the signal ERROR. The control circuit 30 controls the state of the switches S1' and S2'. As in FIG. 1, the switches S1' and S2' may be implemented with transistors.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention. Specifically, it will be apparent to one of ordinary skill in the art that the device of the present invention could be implemented in several different ways and the apparatus disclosed above is only illustrative of the preferred embodiment of the invention and is in no way a limitation. For example, it would be within the scope of the invention to vary the values of the various components disclosed herein.

What is claimed is:

1. A circuit comprising:

a. a voltage source;

b. a ground node;

c. a first PMOS transistor having a first source, a first gate, a first drain and a first aspect ratio, the first source coupled to the voltage source, the first gate coupled to the ground node and the first drain coupled to a first node;

d. a second PMOS transistor having a second source, a second gate, a second drain and a second aspect ratio, wherein the second aspect ratio is greater than the first aspect ratio, the second source coupled to the voltage source and the second drain coupled to a second node;

e. means for varying the voltage level of the second gate, wherein the means for varying the voltage level of the second gate is coupled to the second gate;

f. a first PNP transistor having a first emitter, a first base and a first collector, the first emitter coupled to the first node and the first base coupled to a third node;

g. a first current source having a first terminal and a second terminal, the first terminal of the first current source coupled to the first collector and the second terminal of the first current source coupled to the ground node;

h. a second PNP transistor having a second embitter, a second base and a second collector, the second embitter coupled to the second node, the second base coupled to the third node and the second collector coupled to the third node;

i. a second current source having a first terminal and a second terminal, the first terminal of the second current source coupled to the second collector and the second terminal of the second current source coupled to the ground node;

j. an NMOS transistor, having a third source, a third gate and a third drain, the third gate coupled to the first collector and the third drain coupled to the first node; and k. a resistor having a first resistor terminal and a second resistor terminal, the first resistor terminal coupled to the third source and the second resistor terminal coupled to the ground node.

2. The circuit according to claim 1 further comprising:

a. a first switch having a first terminal and a second terminal, the first terminal of the first switch coupled to the second node and the second terminal of the first switch coupled to a fourth node;

b. a second switch having a first terminal and a second terminal, the first terminal of the second switch coupled to the voltage source and the second terminal of the second switch coupled to the fourth node;

c. means for sensing voltage coupled to the first resistor terminal;

d. an inductor having a first inductor terminal and a second inductor terminal, the first inductor terminal coupled to the second node; and e. a capacitor having a first capacitor terminal and a second capacitor terminal, the first capacitor terminal coupled to the second inductor terminal and the second capacitor terminal coupled to the ground node.

3. A circuit comprising:

a. a first voltage source;

b. a second voltage source;

c. a first NMOS transistor having a first source, a first gate, a first drain and a first aspect ratio, the first source coupled to the second voltage source, the first gate coupled to the first voltage source and the first drain coupled to a first node;

d. a second NMOS transistor having a second source, a second gate, a second drain and a second aspect ratio, wherein the second aspect ratio is greater than the first aspect ratio, the second source coupled to the second voltage source and the second drain coupled to a second node;

e. means for varying the voltage level of the second gate, wherein the means for varying the voltage level of the second gate is coupled to the second gate;

f. a first NPN transistor having a first embitter, a first base and a first collector, the first emitter coupled to the first node and the first base coupled to a third node;

g. a first current source having a first terminal and a second terminal, the first terminal of the first current source coupled to the first collector and the second terminal of the first current source coupled to the first voltage source;

h. a second NPN transistor having a second embitter, a second base and a second collector, the second embitter coupled to the second node, the second base coupled to the third node and the second collector coupled to the third node;

i. a second current source having a first terminal and a second terminal, the first terminal of the second current source coupled to the second collector and the second terminal of the second current source coupled to the first voltage source;

j. a PMOS transistor having a third source, a third gate and a third drain, the third gate coupled to the first collector and the third drain coupled to the first node; and k. a resistor having a first resister terminal and a second resister terminal, the first resistor terminal coupled to the third source and the second resistor terminal coupled to the first voltage source.

4. The circuit according to claim 3 further comprising:

a. a first switch having a first terminal and a second terminal, the first terminal of the first switch coupled to the second node and the second terminal of the first switch coupled to the fourth node;

b. a second switch having a first terminal and a second terminal, the first terminal of the second switch coupled to the second voltage source and the second terminal of the second switch coupled to the second node;

c. means for sensing voltage coupled to the first resistor terminal;

d. an inductor having a first inductor terminal and a second inductor terminal, the first inductor terminal coupled to the second node; and e. a capacitor having a first capacitor terminal and a second capacitor terminal, the first capacitor terminal coupled to the second inductor terminal and the second capacitor terminal coupled to the first voltage source.

5. A circuit for sensing current comprising:

a. an energy storage element having a first terminal and a second terminal;

b. a first transistor having a control terminal and a first aspect ratio, the first transistor configured for selectively applying a supply voltage to the first terminal of the energy storage element according to a control signal applied to the control terminal;

c. a second transistor having a second aspect ratio, the second transistor coupled to the supply voltage and configured for mirroring a current in the first transistor at times when the supply voltage is applied to the first terminal of the energy storage element, wherein a current in the second transistor is related to the current in the first transistor according to a ratio of the first aspect ratio to the second aspect ratio; and d. a circuit for forming a sensing signal representative of a current in the second transistor, wherein the circuit for forming is coupled to the second transistor.

6. The circuit according to claim 5 wherein the first aspect ratio is substantially greater than the second aspect ratio.

7. The circuit according to claim 5 further comprising a control circuit for generating the control signal according to a level of the sensing signal for controlling a current in the energy storage element.

8. The circuit according to claim 7 further comprising a voltage mirror circuit, wherein the voltage mirror circuit comprises:

a. a third transistor having a base, an emitter and a collector, wherein the emitter of the third transistor is selectively coupled to the first terminal of the energy storage element and selectively coupled to the supply voltage;

b. a fourth transistor having a base, an emitter and a collector, wherein the emitter of the fourth transistor is coupled to the second transistor and the base of the fourth transistor is coupled to a base of the third transistor;

c. a first current source coupled to the collector of the third transistor, to the base of the third transistor and to the base of the fourth transistor; and d. a second current source coupled to the collector of the fourth transistor.

9. The circuit according to claim 7 wherein the energy storage element is an inductor.

10. A circuit for sensing current comprising:

a. an energy storage element;

b. a current mirror circuit comprising a first transistor coupled to selectively provide a first current to the energy storage element and comprising a second transistor coupled to provide a second current wherein the second current is substantially proportional to and smaller than the first current;

c. a voltage mirror circuit coupled to a drain of the first transistor and coupled to a drain of the second transistor wherein the voltage mirror circuit maintains a voltage on the drain of the first transistor substantially equal to a voltage on the drain of the second transistor; and d. a circuit for forming a sensing signal representative of a current in the second transistor, wherein the circuit for forming is coupled to the second transistor.

11. The circuit according to claim 10 wherein the first aspect ratio is substantially greater than the second aspect ratio.

12. The circuit according to claim 10 further comprising a control circuit for generating the control signal according to a level of the sensing signal for controlling a current in the energy storage element.

13. The circuit according to claim 12 wherein the voltage mirror circuit comprises:

a. a third transistor having a base, an emitter and a collector, wherein the emitter of the third transistor is selectively coupled to the drain of the first transistor;

b. a fourth transistor having a base, an emitter and a collector, wherein the emitter of the fourth transistor is coupled to the drain of the second transistor and the base of the fourth transistor is coupled to a base of the third transistor;

c. a first current source coupled to the collector of the third transistor, to the base of the third transistor and to the base of the fourth transistor; and d. a second current source coupled to the collector of the fourth transistor.

14. The circuit according to claim 12 wherein the energy storage element is an inductor.

* * * * *

UNITED STATES PATENT AND TRADEMARK OFFICE
CERTIFICATE OF CORRECTION

PATENT NO.   :   5,757,174

DATED        :   May 26, 1998

INVENTOR(S) :    Wing-Hung Ki

It is certified that error appears in the above-identified patent and that said Letters Patent is hereby correct as shown below:

In column 4, line 23, delete "Q of" and insert --$\overline{Q}$ of--.

Signed and Sealed this

First Day of September, 1998

Attest:

BRUCE LEHMAN

*Attesting Officer*          *Commissioner of Patents and Trademarks*